United States Patent
Seng et al.

(10) Patent No.: US 7,368,810 B2
(45) Date of Patent: May 6, 2008

(54) INVERTIBLE MICROFEATURE DEVICE PACKAGES

(75) Inventors: Eric Tan Swee Seng, Singapore (SG); Lim Thiam Chye, Singapore (SG)

(73) Assignee: Micron Technology, Inc., Boise, ID (US)

( * ) Notice: Subject to any disclaimer, the term of this patent is extended or adjusted under 35 U.S.C. 154(b) by 217 days.

(21) Appl. No.: 10/651,913

(22) Filed: Aug. 29, 2003

(65) Prior Publication Data

US 2005/0046000 A1    Mar. 3, 2005

(51) Int. Cl.
*H01L 23/02*    (2006.01)
*H01L 23/28*    (2006.01)
*H01L 23/31*    (2006.01)
*H01L 23/48*    (2006.01)
*H01L 25/10*    (2006.01)

(52) U.S. Cl. .............................. 257/684; 257/E23.004; 257/E23.039; 257/E23.046; 257/E23.023; 257/E23.068; 257/E25.023; 257/676; 257/673; 257/691; 257/692; 257/737; 257/738; 257/784; 257/786; 257/776; 257/778; 257/796

(58) Field of Classification Search ........ 257/E23.039, 257/E23.046, E23.023, E23.004, E23.068, 257/E25.023, 684, 676, 673, 698, 690–693, 257/775, 776, 784, 786, 796, 787, 737, 738
See application file for complete search history.

(56) References Cited

U.S. PATENT DOCUMENTS

| 4,012,579 | A | 3/1977 | Fox et al. |
| 4,862,245 | A | 8/1989 | Pashby et al. |
| 4,996,587 | A | 2/1991 | Hinrichsmeyer et al. |
| 5,107,328 | A | 4/1992 | Kinsman |
| 5,128,831 | A | 7/1992 | Fox, III et al. |
| 5,138,434 | A | 8/1992 | Wood et al. |
| 5,140,404 | A | 8/1992 | Fogal et al. |

(Continued)

FOREIGN PATENT DOCUMENTS

KR    2001087444 A    *  9/2001

OTHER PUBLICATIONS

Carson, John C., "Advances in Chip Level Packaging," Irvine Sensors Corporation, 36 pages, retrieved from the Internet on Jul. 17, 2003, <http://www.ece.jhu.edu/faculty/andreou/495/2002/LectureNotes/PackagingAdvancepdf.pdf>.

Amkor Technology, *Micro*LeadFrame (MLF), 5 pages, retrieved from the Internet on Aug. 1, 2001, <http://www.amkor.com/Products/all_products/MLF.cfm>.

(Continued)

*Primary Examiner*—Alexander Oscar Williams
(74) *Attorney, Agent, or Firm*—Perkins Coie LLP

(57) ABSTRACT

Invertible microfeature device packages and associated methods for manufacture and use are disclosed. A package in accordance with one embodiment includes a microfeature device having a plurality of device contacts, and a conductive structure electrically connected to the contacts. The conductive structure can have first and second package contacts accessible for electrical coupling to at least one device external to the package, with the first package contacts accessible from a first direction and the second package contacts configured to receive solder balls and accessible from a second direction opposite the first. An encapsulant can be disposed adjacent to the microfeature device and the conductive structure and can have apertures aligned with the second package contacts to contain solder balls carried by the second package contacts. Accordingly, the package can be connected in either a face-up or face-down orientation, and/or can be connected to another, similar device in either a face-to-face arrangement or a back-to-back arrangement.

25 Claims, 6 Drawing Sheets

U.S. PATENT DOCUMENTS

| | | | |
|---|---|---|---|
| 5,252,853 A | 10/1993 | Michii | |
| 5,252,857 A | 10/1993 | Kane et al. | |
| 5,304,842 A | 4/1994 | Farnworth et al. | |
| 5,471,369 A | 11/1995 | Honda et al. | |
| 5,475,918 A | 12/1995 | Kubota et al. | |
| 5,518,957 A | 5/1996 | Kim | |
| 5,536,969 A | 7/1996 | Matsuoka | |
| 5,583,371 A | 12/1996 | Hori | |
| 5,593,927 A | 1/1997 | Farnworth et al. | |
| 5,663,593 A | 9/1997 | Mostafazadeh et al. | |
| 5,665,651 A | 9/1997 | Asada et al. | |
| 5,677,566 A * | 10/1997 | King et al. | 257/666 |
| 5,696,033 A | 12/1997 | Kinsman | |
| 5,715,593 A | 2/1998 | Kimura | |
| 5,729,049 A | 3/1998 | Corisis et al. | |
| 5,739,585 A | 4/1998 | Akram et al. | |
| 5,744,827 A | 4/1998 | Jeong et al. | |
| D394,844 S | 6/1998 | Farnworth | |
| 5,815,000 A | 9/1998 | Farnworth et al. | |
| D402,638 S | 12/1998 | Farnworth | |
| 5,847,455 A | 12/1998 | Manteghi | |
| 5,851,845 A | 12/1998 | Wood et al. | |
| 5,866,939 A | 2/1999 | Shin et al. | |
| 5,866,953 A | 2/1999 | Akram et al. | |
| 5,879,965 A | 3/1999 | Jiang et al. | |
| 5,883,426 A | 3/1999 | Tokuno et al. | |
| 5,891,753 A | 4/1999 | Akram | |
| 5,891,797 A | 4/1999 | Farrar | |
| 5,893,726 A | 4/1999 | Farnworth et al. | |
| 5,894,107 A | 4/1999 | Lee et al. | |
| 5,898,224 A | 4/1999 | Akram | |
| 5,933,713 A | 8/1999 | Farnworth | |
| 5,938,956 A | 8/1999 | Hembree et al. | |
| 5,946,553 A | 8/1999 | Wood et al. | |
| 5,956,236 A | 9/1999 | Corisis et al. | |
| 5,958,100 A | 9/1999 | Farnworth et al. | |
| 5,973,393 A * | 10/1999 | Chia et al. | 257/690 |
| 5,973,396 A | 10/1999 | Farnworth | |
| 5,986,209 A | 11/1999 | Tandy | |
| 5,989,941 A | 11/1999 | Wensel | |
| 5,990,566 A | 11/1999 | Farnworth et al. | |
| 5,994,784 A | 11/1999 | Ahmad | |
| RE36,469 E | 12/1999 | Wood et al. | |
| 6,008,070 A | 12/1999 | Farnworth | |
| 6,020,624 A | 2/2000 | Wood et al. | |
| 6,020,629 A | 2/2000 | Farnworth et al. | |
| 6,025,728 A | 2/2000 | Hembree et al. | |
| 6,028,356 A | 2/2000 | Kimura | |
| 6,028,365 A | 2/2000 | Akram et al. | |
| 6,043,430 A * | 3/2000 | Chun | 174/530 |
| 6,046,496 A | 4/2000 | Corisis et al. | |
| 6,048,744 A | 4/2000 | Corisis et al. | |
| 6,048,755 A | 4/2000 | Jiang et al. | |
| 6,049,125 A | 4/2000 | Brooks et al. | |
| 6,051,878 A | 4/2000 | Akram et al. | |
| 6,060,778 A | 5/2000 | Jeong et al. | |
| 6,066,514 A | 5/2000 | King et al. | |
| 6,072,233 A | 6/2000 | Corisis et al. | |
| 6,072,236 A | 6/2000 | Akram et al. | |
| 6,075,284 A | 6/2000 | Choi et al. | |
| 6,075,288 A | 6/2000 | Akram | |
| 6,089,920 A | 7/2000 | Farnworth et al. | |
| 6,093,969 A | 7/2000 | Lin | |
| 6,094,058 A | 7/2000 | Hembree et al. | |
| 6,097,087 A | 8/2000 | Farnworth | |
| 6,103,547 A | 8/2000 | Corisis et al. | |
| 6,107,122 A | 8/2000 | Wood et al. | |
| 6,107,680 A | 8/2000 | Hodges | |
| 6,117,382 A | 9/2000 | Thummel | |
| 6,117,710 A | 9/2000 | Mostafazadeh et al. | |
| 6,124,634 A | 9/2000 | Akram et al. | |
| 6,133,068 A | 10/2000 | Kinsman | |
| 6,137,162 A | 10/2000 | Park et al. | |
| 6,148,509 A | 11/2000 | Schoenfeld et al. | |
| 6,150,710 A | 11/2000 | Corisis | |
| 6,150,717 A | 11/2000 | Wood et al. | |
| 6,153,924 A | 11/2000 | Kinsman | |
| 6,159,764 A | 12/2000 | Kinsman et al. | |
| 6,172,419 B1 | 1/2001 | Kinsman | |
| 6,175,149 B1 | 1/2001 | Akram | |
| 6,181,000 B1 | 1/2001 | Ooigawa et al. | |
| 6,184,465 B1 | 2/2001 | Corisis | |
| 6,198,172 B1 | 3/2001 | King et al. | |
| 6,208,020 B1 | 3/2001 | Minamio et al. | |
| 6,208,519 B1 | 3/2001 | Jiang et al. | |
| 6,210,992 B1 | 4/2001 | Tandy et al. | |
| 6,212,767 B1 | 4/2001 | Tandy | |
| 6,215,175 B1 | 4/2001 | Kinsman | |
| 6,215,177 B1 | 4/2001 | Corisis et al. | |
| 6,225,689 B1 | 5/2001 | Moden et al. | |
| 6,228,548 B1 | 5/2001 | King et al. | |
| 6,228,687 B1 | 5/2001 | Akram et al. | |
| 6,229,202 B1 | 5/2001 | Corisis | |
| 6,232,229 B1 | 5/2001 | Reinberg | |
| 6,235,554 B1 | 5/2001 | Akram et al. | |
| 6,246,108 B1 | 6/2001 | Corisis et al. | |
| 6,246,110 B1 | 6/2001 | Kinsman et al. | |
| 6,258,623 B1 | 7/2001 | Moden et al. | |
| 6,258,624 B1 | 7/2001 | Corisis | |
| 6,259,153 B1 | 7/2001 | Corisis | |
| 6,261,865 B1 | 7/2001 | Akram | |
| 6,265,660 B1 | 7/2001 | Tandy | |
| 6,277,671 B1 | 8/2001 | Tripard | |
| 6,277,704 B1 | 8/2001 | Reinberg | |
| 6,281,577 B1 | 8/2001 | Oppermann et al. | |
| 6,284,571 B1 | 9/2001 | Corisis et al. | |
| 6,291,894 B1 | 9/2001 | Farnworth et al. | |
| 6,294,839 B1 | 9/2001 | Mess et al. | |
| 6,297,543 B1 | 10/2001 | Hong et al. | |
| 6,297,547 B1 | 10/2001 | Akram | |
| 6,303,469 B1 | 10/2001 | Larson et al. | |
| 6,303,981 B1 | 10/2001 | Moden | |
| 6,303,985 B1 | 10/2001 | Larson et al. | |
| 6,303,997 B1 * | 10/2001 | Lee | 257/778 |
| 6,310,390 B1 | 10/2001 | Moden | |
| 6,314,639 B1 | 11/2001 | Corisis | |
| 6,316,285 B1 | 11/2001 | Jiang et al. | |
| 6,326,242 B1 | 12/2001 | Brooks et al. | |
| 6,326,244 B1 | 12/2001 | Brooks et al. | |
| 6,326,687 B1 | 12/2001 | Corisis | |
| 6,326,697 B1 | 12/2001 | Farnworth | |
| 6,326,698 B1 | 12/2001 | Akram | |
| 6,329,220 B1 | 12/2001 | Bolken et al. | |
| 6,329,705 B1 | 12/2001 | Ahmad | |
| 6,331,221 B1 | 12/2001 | Cobbley | |
| 6,331,448 B1 | 12/2001 | Ahmad | |
| 6,331,453 B1 | 12/2001 | Bolken et al. | |
| 6,332,766 B1 | 12/2001 | Thummel | |
| 6,337,510 B1 | 1/2002 | Chun-Jen et al. | |
| 6,339,254 B1 | 1/2002 | Venkateshwaran et al. | |
| 6,344,976 B1 | 2/2002 | Schoenfeld et al. | |
| 6,403,398 B2 | 6/2002 | Ohuchi et al. | |
| 6,429,528 B1 | 8/2002 | King et al. | |
| 6,486,545 B1 | 11/2002 | Glenn et al. | |
| 6,498,393 B2 | 12/2002 | Fujimoto et al. | |
| 6,501,184 B1 | 12/2002 | Shin et al. | |
| 6,516,516 B1 | 2/2003 | Lee | |
| 6,518,659 B1 | 2/2003 | Glenn | |
| 6,528,722 B2 * | 3/2003 | Huang et al. | 174/528 |
| 6,576,494 B1 | 6/2003 | Farnworth | |
| 6,630,729 B2 | 10/2003 | Huang | |
| 6,784,023 B2 * | 8/2004 | Ball | 438/113 |
| 6,784,525 B2 * | 8/2004 | Kuan et al. | 257/676 |

| | | | |
|---|---|---|---|
| 6,787,393 B2* | 9/2004 | Jin et al. | 438/112 |
| 6,819,003 B2 | 11/2004 | Farnworth | |
| 6,830,955 B2 | 12/2004 | Shin et al. | |
| 6,836,009 B2* | 12/2004 | Koon et al. | 257/692 |
| 6,841,863 B2* | 1/2005 | Baik et al. | 257/686 |
| 6,847,104 B2* | 1/2005 | Huang et al. | 257/685 |
| 6,876,066 B2 | 4/2005 | Fee et al. | |
| 6,946,325 B2* | 9/2005 | Yean et al. | 438/112 |
| 7,049,684 B2* | 5/2006 | Minamio et al. | 257/666 |
| 7,195,957 B2* | 3/2007 | Koon et al. | 438/124 |
| 7,259,451 B2* | 8/2007 | Seng et al. | 257/686 |
| 2001/0000053 A1* | 3/2001 | Suh et al. | 257/686 |
| 2001/0013645 A1* | 8/2001 | King et al. | 257/678 |
| 2002/0046854 A1* | 4/2002 | Huang et al. | 174/52.1 |
| 2003/0104654 A1 | 6/2003 | Farnworth | |
| 2003/0205801 A1* | 11/2003 | Baik et al. | 257/686 |
| 2004/0026773 A1* | 2/2004 | Koon et al. | 257/692 |
| 2004/0036180 A1* | 2/2004 | Ho et al. | 257/778 |
| 2004/0080031 A1* | 4/2004 | Huang et al. | 257/678 |
| 2004/0100772 A1 | 5/2004 | Chye et al. | |
| 2004/0150088 A1* | 8/2004 | Corisis | 257/684 |
| 2004/0155331 A1* | 8/2004 | Thurgood et al. | 257/729 |
| 2005/0023655 A1 | 2/2005 | Fee et al. | |
| 2005/0026325 A1* | 2/2005 | Koon et al. | 438/107 |
| 2005/0046000 A1 | 3/2005 | Seng et al. | |
| 2005/0179119 A1* | 8/2005 | Lien | 257/666 |
| 2006/0006534 A1* | 1/2006 | Yean et al. | 257/737 |

OTHER PUBLICATIONS

Amkor Technology, Application Notes for Surface Mount Assembly of Amkor's *Micro*LeadFrame (MLF) Packages, 14 pages, Mar. 2001.

Amkor Technology, Automotive/Thermal Enhanced Power Products, 16 pages, Aug. 2000.

Amkor Technology, RF Wireless Fact Sheet, 1 page, Feb. 2000.

Ishino, Toshiaki, Silicone Adhesive Tape, Nitto Technical Report, vol. 38, No. 2, pp. 49-50, Dec. 2000, <http://www.nitto.com/rd/2000_2/15ishinoe.qxp.pdf>.

Kuhnlein, Gerd, "A design and manufacturing solution for high reliable non-leaded CSP's like QFN," 2000 Electronics Packaging Technology Conference, IEEE, pp. 169-175.

Tech Connect, QFN Leadframes, ASM Pacific Technology Ltd., pp. 10-14.

Siliconware Precision Industries Ltd., TSPO 1 (Thin Small Outline Package type1), 2 pages, retrieved from the Internet on Jun. 26, 2003, <http://www.spil.com.tw/tsopi.html>.

Intersil, L56.8X8 56 Lead Quad Flat No-Lead Plastic Package, 1 page, Dec. 2002, <http://www.intersil.com/data/pk/L56.8x8.pdf>.

Search Report and Written Opinion for Singapore Application No. 200305590-2, 6 pages, Aug. 30, 2007.

\* cited by examiner

INVERTIBLE MICROFEATURE DEVICE PACKAGES

TECHNICAL FIELD

The present invention relates generally to invertible microfeature device packages and associated methods for manufacturing and installing such packages.

BACKGROUND

Microfeature devices, such as memory chips, are typically incorporated into a device package prior to installation in an end product. The package can include an encapsulant that protects the chip, and a leadframe that connects chip terminals (located on the chip and surrounded by the encapsulant) with package terminals that are accessible from outside the package. The package terminals can accordingly provide for communication between the chip and devices located external to the package.

The package terminals are typically arranged in a pattern that conforms to industry developed standards, so that the package is installable in a wide variety of electronic devices. Such standards have been developed for ball grid array (BGA) arrangements and quad flat no-lead (QFN) plastic package arrangements. However, device packages manufactured to be compatible with one standard attachment arrangement are typically not compatible with others. Accordingly, the versatility of such device packages is limited, and package manufacturers and suppliers must therefore manufacture and inventory packages compatible with a multitude of attachment arrangements.

DETAILED DESCRIPTION

A. Introduction

Figure 1A:
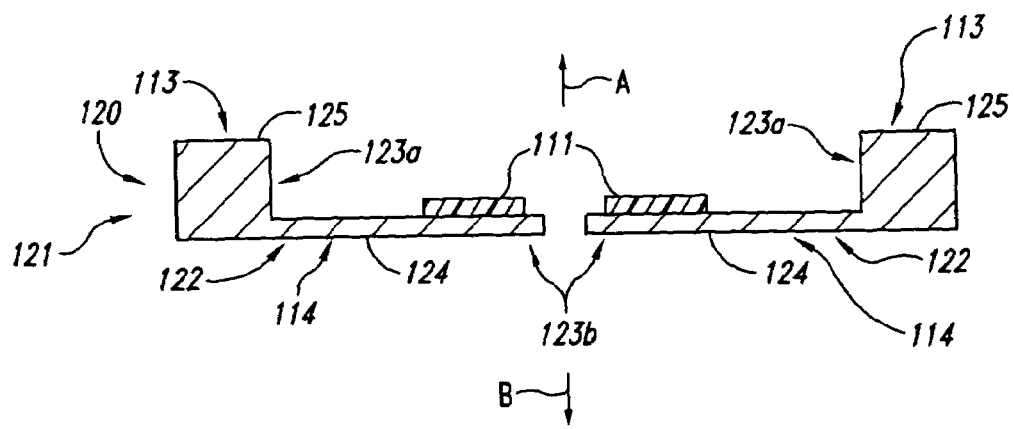
FIGS. 1A-1C illustrate a method for attaching a microfeature device to a conductive structure in accordance with an embodiment of the invention.

The present invention is directed to invertible microfeature device packages and associated methods for manufacturing and installing such packages. The term "microfeature device" is used throughout to include a device formed from a substrate upon which and/or in which submicron circuits or components, and/or data storage elements or layers are fabricated. Submicron features in the substrate include, but are not limited to, trenches, vias, lines, and holes. These features typically have a submicron width (e.g., ranging from, for example, 0.1 micron to 0.75 micron) generally transverse to a major surface (e.g., a front side or a back side) of the device. The term microfeature device is also used to include substrates upon which and/or in which micromechanical features are formed. Such features include read/write head features and other micromechanical features having submicron or supramicron dimensions. In any of these embodiments, the substrate is formed from suitable materials, including ceramics, and may support layers and/or other formations of other materials, including but not limited to metals, dielectric materials and photoresists.

A microfeature device package system in accordance with one aspect of the invention includes a microfeature device, a plurality of device contacts electrically coupled to structures within the microfeature device, and a conductive structure electrically connected to at least one of the plurality of device contacts. The conductive structure can have a plurality of first and second package contacts accessible for electrical coupling to at least one device external to the package. The first package contacts can be accessible from a first direction for coupling, and the second package contacts can be configured to receive solder balls and can be accessible from a second direction for coupling, the second direction being opposite the first direction. An encapsulant can be disposed adjacent to the microfeature device and the conductive structure, and can have apertures with aperture walls aligned with the second package contacts to contain solder balls carried by the second package contacts. Accordingly, the packaged microfeature device can be oriented in one direction for coupling to one type of substrate, and can be inverted for coupling to another type of substrate for which solder balls provide the intervening electrical connection.

A microfeature device package in accordance with another aspect of the invention includes a first microfeature device having a plurality of first device contacts and a second microfeature device having a plurality of second device contacts. The second microfeature device is coupleable to the first microfeature device in either of two orientations wherein in a first orientation the second device contacts face toward the first device contacts, and in a second orientation the first and second device contacts face in opposite directions. A conductive structure is positioned at least proximate to the first and second microfeature devices and is electrically connected to at least one of the first device contacts and to at least one of the second device contacts.

A method for forming a microfeature device package in accordance with another aspect of the invention includes disposing a conductive structure at least proximate to a microfeature device, with the conductive structure having a plurality of first and second package contacts. The microfeature device can further have a plurality of device contacts electrically coupled to structures within the microfeature device. The method can further include orienting the conductive structure with the first and second package contacts accessible for electrical coupling to devices external to the package. The first package contacts can be accessible from a first direction for coupling and the second package contacts can be accessible from a second direction for coupling, with the second direction opposite the first direction. The method can further include electrically coupling the conductive structure to the device contacts of the microfeature device, and disposing an encapsulant adjacent to the conductive structure. The encapsulant can include apertures aligned with the second package contacts, and aperture walls positioned to contain solder balls at the second package contacts.

B. Methods and Apparatuses in Accordance with the Embodiments of the Invention

Specific details of the invention are set forth in the following description and in FIGS. 1A-8 to provide a thorough understanding of certain embodiments of the invention. One skilled in the art, however, will understand that the present invention may have additional embodiments, and that other embodiments of the invention may be practiced without several of the specific features explained in the following description.

Figure 1B:
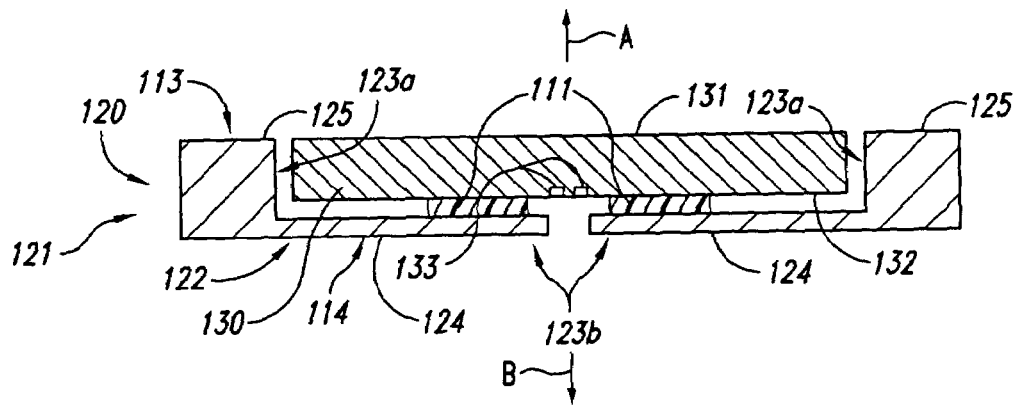
Figure 1C:
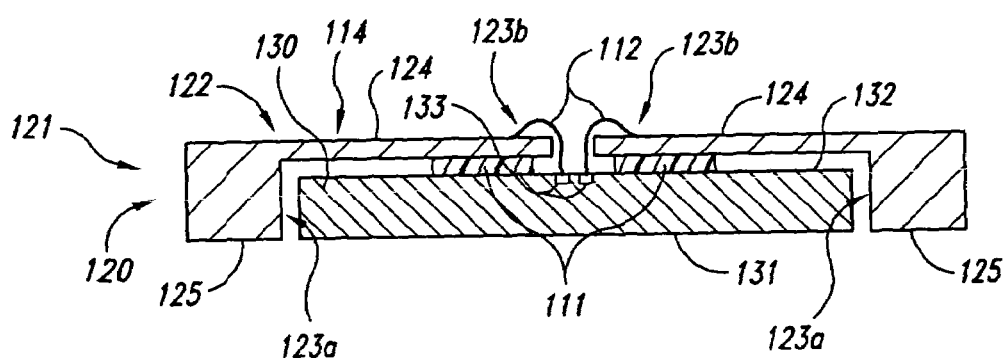

FIGS. 1A-1C are partially schematic, cross-sectional side views illustrating initial portions of a process for forming a package in accordance with an embodiment of the invention. Referring first to FIG. 1A, the package can include a conductive structure 120, for example, a leadframe 121 having a plurality of leadfingers 122. Each leadfinger can include a first end portion 123a, a second end portion 123b, and an intermediate portion 124 between the end portions 123a, 123b. The first end portion 123a can include an end surface 125 facing in a first direction A and the intermediate portion 124 can face in a second direction B, opposite the first direction A. As described in greater detail below, the end surfaces 125 can form first package contacts 113 accessible from the first direction A, and the intermediate portions 124 can form second package contacts 114 accessible from the second direction B. The second end portions 123b can support tape strips 111 or other adhesive media for attachment to a microfeature device, as described in greater detail below with reference to FIG. 1B.

Referring now to FIG. 1B, a microfeature device 130 can be attached to the tape strips 111 prior to being electrically coupled to the conductive structure 120. In one aspect of the embodiment, the microfeature device 130 can include a memory device and in other embodiments, the microfeature device 130 can include another type of device, for example, a processor device. In any of these embodiments, the microfeature device 130 can include a first surface 131 facing in the first direction A, and a second surface 132 facing in the second direction B. Device contacts 133 (e.g., bond pads) can be positioned at or proximate to the second surface 132 to provide for electrical communication between the conductive structure 120 and structures or features located within the microfeature device 130.

Referring now to FIG. 1C, the microfeature device 130 and the conductive structure 120 can be inverted as a unit. Wirebonds 112 can then be connected between the second end portions 123b of the leadfingers 122 and the device contacts 133 to provide for electrical communication between the microfeature device 130 and the conductive structure 120. In other embodiments, conductive pathways between the device bond pads 133 and the conductive structure 120 are formed from other connecting elements.

Figure 2:
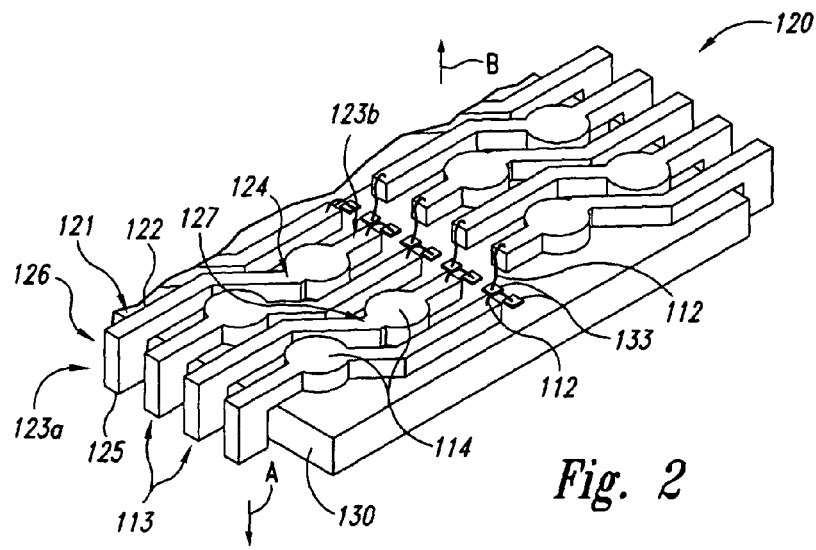
FIG. 2 is an isometric illustration of a portion of a microfeature device attached to a conductive structure in accordance with an embodiment of the invention.

FIG. 2 is a partially schematic, isometric illustration of a portion of the microfeature device 130 and the conductive structure 120 described above with reference to FIGS. 1A-1C. As shown in FIG. 2, the conductive structure 120 can include a first terminal portion 126 and a second terminal portion 127. The first terminal portion 126 can include the first package contacts 113 facing in the first direction A, and the second terminal portion 127 can include the second package contacts 114 facing in the second direction B. In one aspect of this embodiment, the first package contacts 113 include the generally flat end surfaces 125 of the leadfingers 122. The second package contacts 114 can include flat, disk-shaped surfaces of the leadfinger intermediate portions 124. In other embodiments, the first package contacts 113 and the second package contacts 114 can have different shapes that also face in opposing directions, and (as described in greater detail below) support solder ball connections at the second package contacts 114 and other connections, including QFN connections, at the first package contacts 113.

Figure 3A:
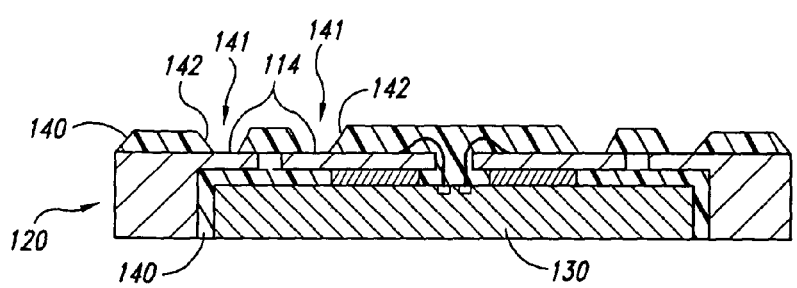
FIGS. 3A-3C illustrate a method for packaging the microfeature device and the conductive structure shown in FIGS. 1A-2.

Referring now to FIG. 3A, the microfeature device 130 and the conductive structure 120 can next be at least partially surrounded with an encapsulant 140. In a particular aspect of this embodiment, the encapsulant 140 can include apertures 141 aligned with the second package contacts 114. In one embodiment, the apertures 141 are etched or otherwise formed in the encapsulant 140 after the encapsulant 140 has been disposed over the conductive structure 120 and the microfeature device 130. In another embodiment, the apertures 141 are formed in the encapsulant 140 as the encapsulant is disposed over the conductive structure 120 and the microfeature device 130. In either embodiment, the apertures 141 can include aperture walls 142 positioned adjacent to the second package contacts 114 to support solder balls, as described below with reference to FIG. 3B.

Figure 3B:
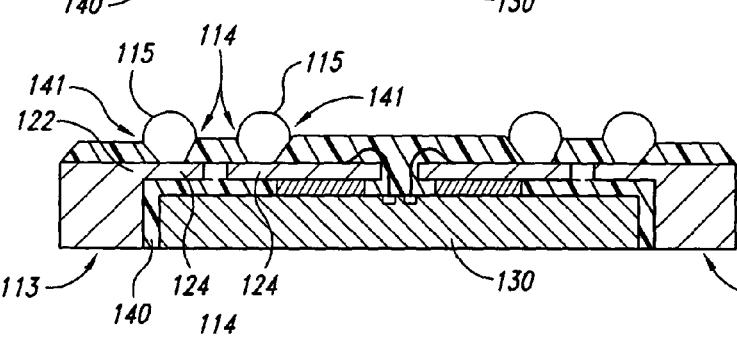

Referring now to FIG. 3B, solder balls 115 can be disposed on the intermediate portions 124 of the lead fingers 122 through the apertures 141 of the encapsulant 140. Accordingly, the solder balls 115 can form a conductive portion of the second package contacts 114. In one aspect of this embodiment, the solder balls 115 can be disposed as part of the package manufacturing process. In another embodiment, the solder balls 115 can be disposed in a post-manufacture step. In still a further embodiment, the solder balls 115 can be eliminated (for example, when only the first package contacts 113 will be coupled to external devices) although the second package contacts 114 can remain configured to support the solder balls 115.

Figure 3C:
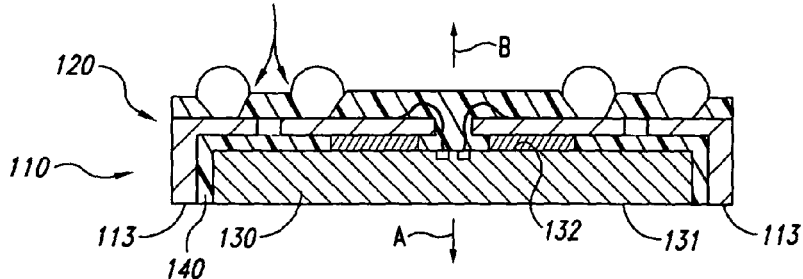

Referring next to FIG. 3C, a complete package 110 can be formed by singulating the conductive structure 120 from adjacent conductive structures (not shown), which are connected to other microfeature devices 130. The singulation process can also reduce an overall width of the package 110, while leaving the first package contacts 113 accessible for coupling to external devices from the first direction A, and the second package contacts 114 accessible for coupling to external devices from the second direction B.

Figure 4A:
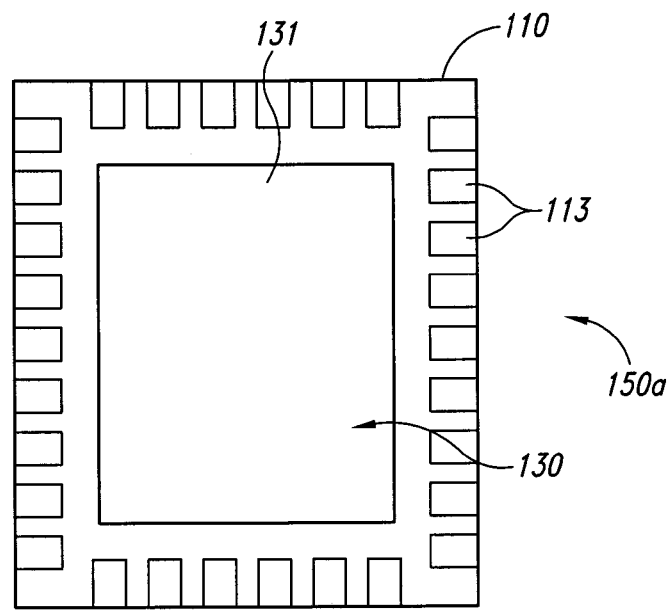
FIGS. 4A and 4B illustrate opposing outwardly facing surfaces of a package formed in accordance with an embodiment to the invention.

FIG. 4A is a plan view of an embodiment of the package described above with reference to FIG. 3C, as seen from the first direction A. As shown in FIG. 4A, the first package contacts 113 can be disposed around the periphery of the package 110 to form a first pattern 150A (e.g., a QFN arrangement). Accordingly, the first package contacts 113 are suitable for coupling to other devices compatible with a standard QFN contact arrangement. As is also shown in FIG. 4A, the first surface 131 of the microfeature device 130 can be exposed (or can remain exposed) after the process of forming the package 110 has been completed. Accordingly, the rate at which heat is transferred away from the microfeature device 130 can be enhanced by virtue of the increased exposed surface area of the first surface 131.

Figure 4B:
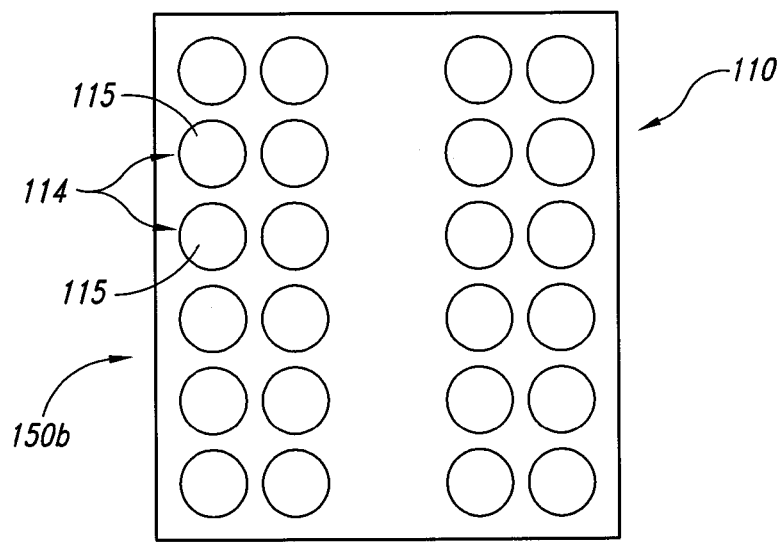

FIG. 4B is a plan view of an embodiment of the package 110 described above with reference to FIG. 3C, as seen from the second direction B. As shown in FIG. 4B, the second package contacts 114 can be disposed inwardly from the edges of the package 110 and can form a second pattern 150b that is different than the first pattern 150a described above with reference to FIG. 4A. The second pattern 150b can be suitable for coupling the package 110 to devices having a standard BGA interface.

Figure 5A:
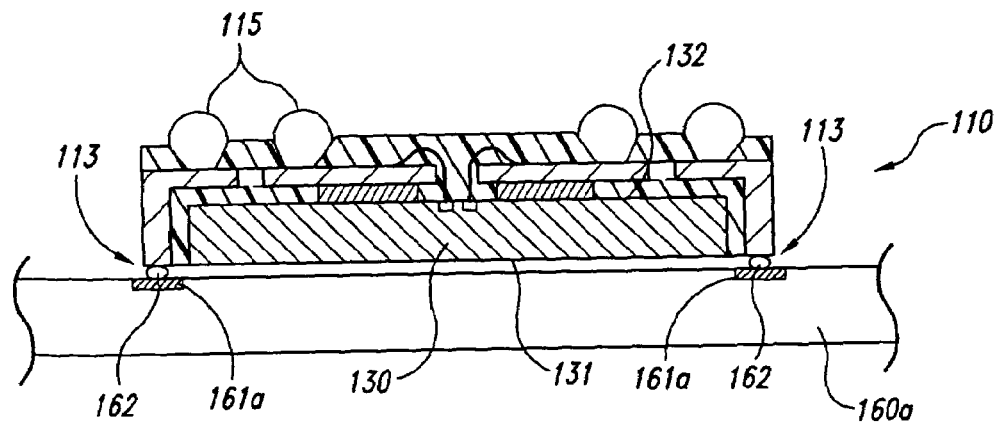
FIGS. 5A-5B illustrate a microfeature device package attached to a support member in two positions, one inverted relative to the other.
Figure 5B:
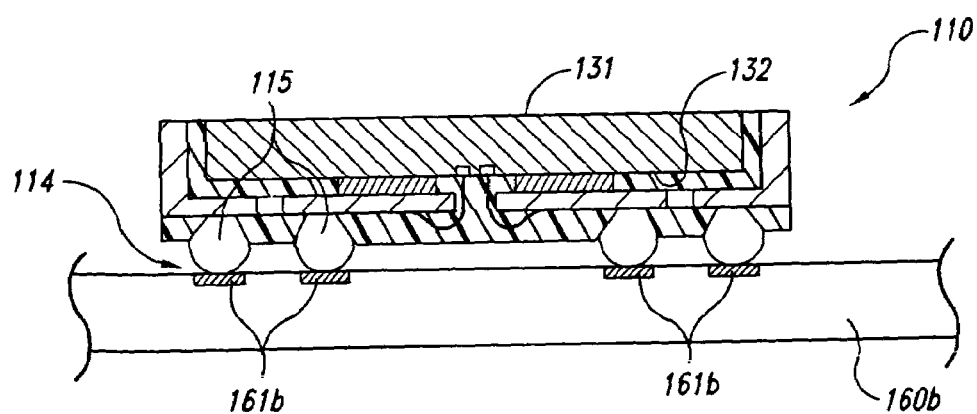

FIGS. 5A and 5B illustrate the package 110 connected to support members while in each of two oppositely facing orientations, in accordance with an embodiment of the invention. Referring first to an embodiment shown in FIG. 5A, the package 110 can be positioned proximate to a support member 160a with the first surface 131 of the microfeature device 130 and the first package contacts 113 facing toward the support member 160a. The support member 160a can include an external terminal portion that includes support member bond pads 161a aligned with the corresponding first package contacts 113. Solder paste 162 can be disposed between the first package contacts 113 and the support member bond pads 161a to electrically couple the package 110 to the support member 160a, using standard QFN bonding techniques. In one embodiment, the support member 160a can include a printed circuit board having internal and/or surface mounted circuitry, and in other embodiments, the support member 160a can include other devices. When the package 110 is connected to the support member 160a in the manner shown in FIG. 5A, the solder balls 115 can be eliminated because the connection between the package 110 and the support member 160a is provided by the first package contacts 113.

Referring now to FIG. 5B, a device package 110 having exactly the same configuration as that shown in FIG. 5A can be inverted so that the second package contacts 114 and the second surface 132 of the microfeature device 130 face toward a support member 160b. The support member 160b can include support member bond pads 161b arranged in a standard BGA pattern. Accordingly, the solder balls 115 can be connected between the second device package 110 and the support member bond pads 161b using standard BGA bonding techniques to provide for the electrical link between the support member 160b and the microfeature device 130.

One feature of an embodiment of the microfeature device package 110 described above with reference to FIGS. 1A-5B is that the package 110 has different types and arrangements of package contacts. Accordingly, the package 110 can be placed in a first orientation to connect to a device having a first coupling arrangement (for example, a QFN-compatible device) and can be inverted for attachment to a device having a different type of attachment arrangement (for example, a BGA-compatible device). An advantage of this feature is that the same package 110 can be used in either installation. Accordingly, a manufacturer need not maintain separate production lines or separate inventories of packages suitable for coupling to external devices having different types of coupling arrangements. As a result, the cost for producing the microfeature devices 110 can be reduced when compared with the cost of producing existing devices.

Figure 6:
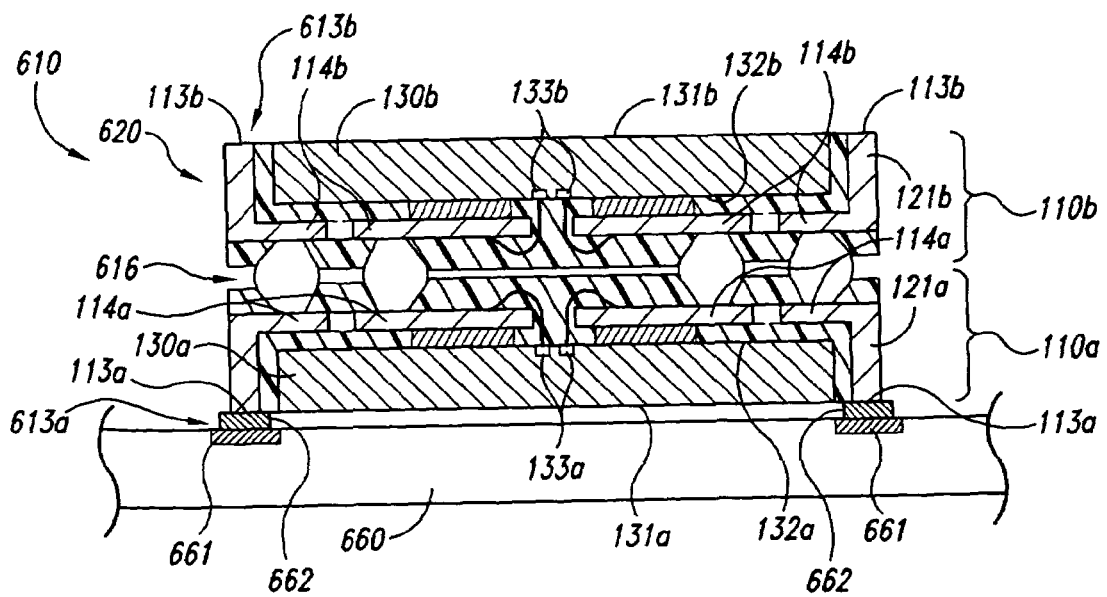
FIG. 6 is a partially schematic, cross-sectional illustration of a device package having two microfeature devices stacked in accordance with an embodiment of the invention.

FIG. 6 is a partially schematic, cross-sectional side elevation view of a stacked device package 610 that includes two microfeature devices 130, shown in FIG. 6 as a first microfeature device 130a and a second microfeature device 130b. In one aspect of this embodiment, the first microfeature device 130a is installed in a first package 110a, and the second microfeature device 130b is installed in a second package 110b. The packages 110a, 110b can be generally similar to the package 110 described above with reference to FIGS. 1A-5B. In other embodiments, the packages 110a, 110b can have other arrangements. In a particular embodiment, second package contacts 114a of the first package 110a are arranged to form a mirror image of the second package contacts 114b of the second package 110b. Accordingly, output signals from one of the packages 110a, 110b can provide input signals to the other package. In any of the foregoing embodiments, the first microfeature device 130a and the second microfeature device 130b are electrically coupled to each other with a conductive structure 620, as described below.

In one aspect of this embodiment, the conductive structure 620 can extend between and around the microfeature devices 130a, 130b. In a particular aspect of this embodiment, the conductive structure 620 can include a first leadframe 121a (which can form a portion of the first package 110a) and a second leadframe 121b (which can form a portion of the second package 110b). In a further particular aspect of this embodiment, the first microfeature device 130a and the second microfeature device 130b are oriented so that a second surface 132a of the first microfeature device 130a faces toward a second surface 132b of the second microfeature device 130b. Accordingly, first device bond pads 133a of the first microfeature device 130 face toward second device bond pads 133b of the second microfeature device 130, and a first surface 131a of the first microfeature device 130a faces away from a first surface 131b of the second microfeature device 130b. In another embodiment, the orientations of the first and second microfeature devices 130a, 130b can be inverted, for example, as described in greater detail below with reference to FIG. 7. In either embodiment, the stacked device package 610 can include couplers 616 that electrically connect the first microfeature device 130a to the second microfeature device 130b. For example, the couplers 616 can include solder balls connected between the first leadframe 121a and the second leadframe 121b. In other embodiments, the couplers 616 can include other conductive structures.

In one aspect of an embodiment shown in FIG. 6, the stacked device package 610 includes two arrays 613 of first package contacts 113, shown as a first array 613a and a second array 613b. Both package contact arrays 613a, 613b have similar or identical layouts. Accordingly, the stacked device package 610 can be positioned with either the first contact array 613a or the second contact array 613b facing toward a support member 660. The support member 660 can include support member bond pads 661 positioned to make electrical contact with either the first contact array 613a or the second contact array 613b. Solder paste 662 or another conductive medium can provide for physical and electrical coupling between the contact array 613 and the support member bond pads 661.

Figure 7:
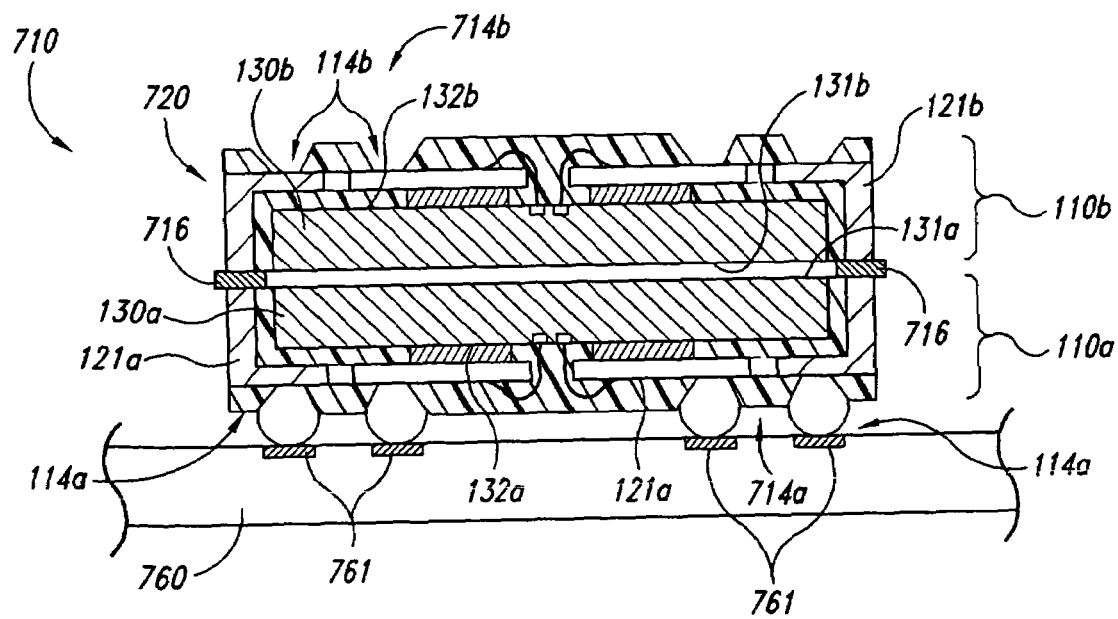
FIG. 7 is a partially schematic, cross-sectional side view of a device package having microfeature devices stacked in accordance with another embodiment of the invention.

FIG. 7 is a cross-sectional side elevation view of a stacked device package 710 having the first and second packages 110a, 110b stacked in an arrangement that is inverted from that shown in FIG. 6. Accordingly, the first surface 131a of the first microfeature device 130a faces toward the first surface 131b of the second microfeature device 130b, and the second surfaces 132a, 132b of the devices 130a, 130b face away from each other. As a result, it is the second package contacts 114a, 114b (arranged in two arrays 714a, 714b) that are exposed for coupling to a support member 760. Couplers 716 (e.g., solder paste couplers) can physically and electrically connect the first leadframe 121a to the second leadframe 121b to form the conductive structure 720. In another embodiment, the conductive structure 720 can have other arrangements. In any of these embodiments, either of the contact arrays 714a, 714b can be aligned with corresponding support member bond pads 761 to provide for physical and electrical communication between the support member 760 and the stacked device package 710.

One feature of the stacked device packages described above with reference to FIGS. 6 and 7 is that the microfeature devices 130 are positioned either face-to-face or back-to-back, for example, either with the first surfaces 131a, 131b facing toward each other, or with the first surfaces 131a, 131b facing in opposite directions. One advantage of this feature is that the exposed package contacts can have the same arrangement, whether the package is face up or face down. Accordingly, the effort required to correctly orient the stacked device package for coupling to the support member can be reduced when compared with existing devices.

Figure 8:
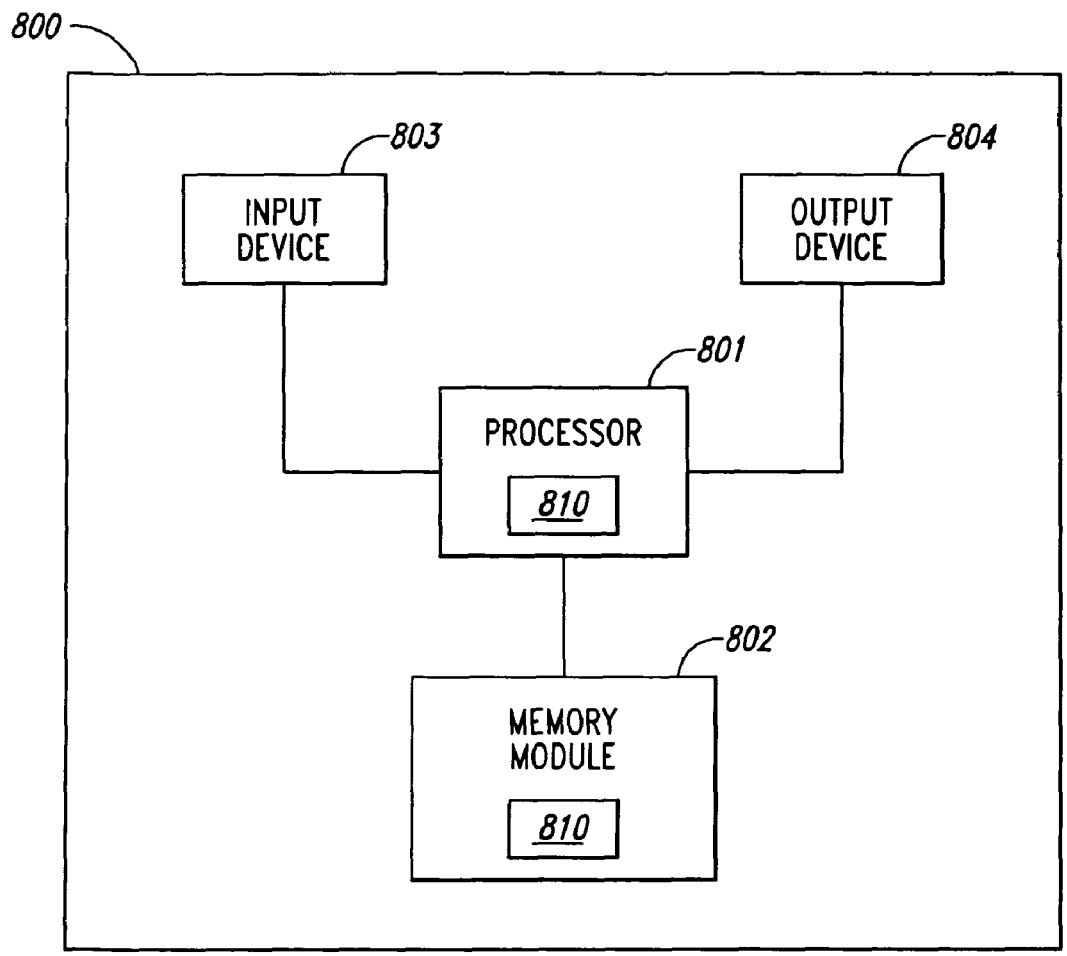
FIG. 8 is a block diagram illustrating features of a system that incorporates one or more packaged microfeature devices in accordance with an embodiment of the invention.

FIG. 8 is a block diagram illustrating components of a system 800 in which one or more packages of the type described above with reference to FIGS. 1A-7 can be incorporated. In one aspect of this embodiment, the system 800 includes a processor 801 coupled to an input device 803 and an output device 804. The processor 801 can also be coupled to a memory module 802. In one aspect of this embodiment, the system 800 includes a computer and in other embodiments, the system 800 can include other devices, for example, a telecommunication device. In any of these embodiments, the system 800 can include one or more packages 810 incorporated, for example, in the processor 801 and/or in the memory module 802. The packages 810 can have a stacked arrangement (generally similar to that described above with reference to FIGS. 6 and 7) or an unstacked arrangement (generally similar to that described above with reference to FIGS. 1A-5B). In either embodiment, the packages can be mounted to a support member (e.g., a printed circuit board) in accordance with any of the arrangements described above. In any of the foregoing embodiments, the packages 810 can be more easily integrated into the system 800, as described above, and can have a reduced cost when compared with conventional packages, also as described above. Accordingly, the system 800 can be less expensive to manufacture than conventional systems.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A microfeature device package system, comprising:
 a microfeature device;
 a plurality of device contacts electrically coupled to structures within the microfeature device;
 a conductive structure at least partially enclosing a cavity housing the microfeature device and electrically connected to at least one of the plurality of device contacts, the conductive structure having a plurality of first and second package contacts, individual first and second package contacts having contact surfaces accessible for electrical coupling to at least one device external to the package, the first package contacts being accessible from a first direction for coupling and the second package contacts being configured to receive solder balls and being accessible from a second direction for coupling, the second direction being opposite the first direction;
 an encapsulant disposed adjacent to the microfeature device and the conductive structure, the encapsulant having apertures aligned with the second package contacts and containing solder balls carried by the second package contacts, the encapsulant being positioned against the conductive structure proximate to the first package contacts and including aperture walls extending outwardly from the contact surfaces of the second package contacts; and
 individual volumes of solder positioned at individual first package contacts.

2. The system of claim 1 wherein the conductive structure includes a leadframe having a plurality of elongated leadfingers, and wherein the first package contacts includes generally flat, elongated surfaces of the leadfingers, and wherein the second package contacts include end surfaces of the leadfingers.

3. The system of claim 1 wherein the microfeature device has an at least generally planar first surface facing in the first direction and an at least generally planar second surface facing in the second direction, and wherein the plurality of device contacts are positioned at least proximate to the second surface.

4. The system of claim 1 wherein the first package contacts are arranged in a first pattern, and wherein the second package contacts are arranged in a second pattern different than the first pattern.

5. The system of claim 1 wherein the first package contacts are arranged adjacent to a periphery of the package, and wherein the second package contacts are arranged in an array with at least some of the second package contacts spaced apart from the periphery of the package.

6. The system of claim 1, further comprising solder balls disposed on the second package contacts.

7. The system of claim 1 wherein the conductive structure includes a leadframe attached to the microfeature device, and wherein the leadframe includes a plurality of elongated leadfingers, with each leadfinger having a first end portion positioned to make electrical contact a first type of external device, each leadfinger further having a second end portion wirebonded to at least one of the device contacts, each leadfinger still further having an intermediate portion between the first and second end portions, the intermediate portion carrying a solder ball to make electrical contact with a second type of external device.

8. The system of claim 1 wherein the microfeature device includes a first microfeature device and wherein the device contacts include first device contacts, and wherein the package further comprises a second microfeature device having second device contacts and being stacked relative to the first microfeature device, with the conductive structure being electrically connected to at least one of the second device contacts.

9. The system of claim 1, further comprising the device external to the package, and wherein the device external to the package includes a printed circuit board having circuitry electrically coupled to of the first package contacts or the second package contacts.

10. The system of claim 1, further comprising:
 the device external to the package, and wherein the device external to the package includes a printed circuit board having circuitry electrically coupled to the first package contacts or the second package contacts;
 at least one of a processor and a memory device coupled to the printed circuit board;
 an input device coupled to the printed circuit board;
 an output device coupled to the printed circuit board; and
 an enclosure disposed around the printed circuit board and the microfeature device.

11. The system of claim 1 wherein the microfeature device includes a memory chip.

12. A microfeature device package system, comprising:
a microfeature device having a plurality of device contacts;
a conductive structure at least partially enclosing a cavity housing the microfeature device and electrically connected to at least one of the plurality of device contacts, the conductive structure having a plurality of first package contacts and second package contacts, individual first and second package contacts having contact surfaces accessible for electrical coupling to at least one device external to the package, the first package contacts being accessible from a first direction and the second package contacts being accessible from a second direction opposite the first direction; and
an encapsulant disposed adjacent to the microfeature device and the conductive structure, the encapsulant having apertures aligned with the second package contacts and having aperture walls extending outwardly from the contact surfaces of the second package contacts.

13. The system of claim 12 wherein the conductive structure includes a leadframe having a plurality of elongated leadfingers, and wherein the first package contacts includes generally flat, elongated surfaces of the leadfingers, and wherein the second package contacts include end surfaces of the leadfingers.

14. The system of claim 12 wherein the first package contacts are arranged in a first pattern, and wherein the second package contacts are arranged in a second pattern different than the first pattern.

15. The system of claim 12, further comprising solder balls disposed in the apertures of the encapsulant and in contact with the contact surfaces of the second package contacts.

16. A microfeature device package system, comprising:
a microfeature device having a plurality of device contacts;
a leadframe at least partially enclosing a cavity housing the microfeature device and electrically connected to at least one of the plurality of device contacts, the leadframe having a plurality of first package contacts and second package contacts with individual first and second package contacts having contact surfaces accessible for electrical coupling to at least one device external to the package, the first package contacts being accessible from a first direction and the second package contacts being accessible from a second direction opposite the first direction; and
an encapsulant disposed adjacent to the microfeature device and the leadframe, the encapsulant having apertures aligned with the second package contacts and having aperture walls extending outwardly from the contact surfaces of the second package contacts.

17. A microfeature device package system, comprising:
a microfeature device having a plurality of device contacts;
a leadframe at least partially enclosing a cavity housing the microfeature device and electrically connected to at least one of the plurality of device contacts, the leadframe having a plurality of first package contacts and second package contacts with individual first and second package contacts having contact surfaces accessible for electrical coupling to at least one device external to the package, the first package contacts being accessible from a first direction and the second package contacts being accessible from a second direction opposite the first direction; and
an encapsulant disposed adjacent to the microfeature device and the leadframe, wherein the package system includes a plurality of openings aligned with the second package contacts, wherein the leadframe includes a plurality of leadfingers, and wherein individual leadfingers include a first portion and a second portion forming an "L" shape, and wherein the first package contacts are at the first portions and the second package contacts are at the second portions.

18. A microfeature device package system, comprising:
a microfeature device having a plurality of device contacts;
a leadframe at least partially enclosing a cavity housing the microfeature device and electrically connected to at least one of the plurality of device contacts, the leadframe having a plurality of first package contacts and second package contacts with individual first and second package contacts having contact surfaces accessible for electrical coupling to at least one device external to the package, the first package contacts being accessible from a first direction and the second package contacts being accessible from a second direction opposite the first direction; and
an encapsulant disposed adjacent to the microfeature device and the leadframe, wherein the package system includes a plurality of openings aligned with the second package contacts, wherein the microfeature device has an exposed surface facing the first direction, the surface of the microfeature device being generally co-planar with the first package contacts.

19. The system of claim 17 wherein the first package contacts include generally flat, elongated surfaces of the leadfingers, and wherein the second package contacts include end surfaces of the leadfingers.

20. The system of claim 17 wherein the microfeature device has an at least generally planar first surface facing in the first direction and an at least generally planar second surface facing in the second direction, and wherein the plurality of device contacts are positioned at least proximate to the second surface.

21. The system of claim 17 wherein the first package contacts are arranged in a first pattern, and wherein the second package contacts are arranged in a second pattern different than the first pattern.

22. The system of claim 17, further comprising solder balls disposed on the second package contacts.

23. The system of claim 18 wherein the first package contacts include generally flat, elongated surfaces of the leadfingers, and wherein the second package contacts include end surfaces of the leadfingers.

24. The system of claim 18 wherein the first package contacts are arranged in a first pattern, and wherein the second package contacts are arranged in a second pattern different than the first pattern.

25. The system of claim 18, further comprising solder balls disposed on the second package contacts.

* * * * *